United States Patent
Choi

(10) Patent No.: US 10,256,207 B2
(45) Date of Patent: Apr. 9, 2019

(54) CLIP-BONDED SEMICONDUCTOR CHIP PACKAGE USING METAL BUMPS AND METHOD FOR MANUFACTURING THE PACKAGE

(71) Applicant: JMJ Korea Co., Ltd., Bucheon-si (KR)

(72) Inventor: Yunhwa Choi, Bucheon-si (KR)

(73) Assignee: JMJ KOREA CO., LTD., Bucheon-si (KR)

( * ) Notice: Subject to any disclaimer, the term of this patent is extended or adjusted under 35 U.S.C. 154(b) by 2 days.

(21) Appl. No.: 15/958,581

(22) Filed: Apr. 20, 2018

(65) Prior Publication Data

US 2018/0240770 A1   Aug. 23, 2018

Related U.S. Application Data

(63) Continuation-in-part of application No. 15/407,198, filed on Jan. 16, 2017.

(30) Foreign Application Priority Data

Jan. 19, 2016   (KR) .................... 10-2016-0006330

(51) Int. Cl.
   *H01L 23/495*   (2006.01)
   *H01L 23/00*   (2006.01)
   *H01L 23/433*   (2006.01)

(52) U.S. Cl.
   CPC .......... *H01L 24/34* (2013.01); *H01L 23/4334* (2013.01); *H01L 23/4952* (2013.01); *H01L 23/49513* (2013.01); *H01L 23/49524* (2013.01); *H01L 23/49555* (2013.01); *H01L 23/49575* (2013.01); *H01L 24/08* (2013.01); *H01L 24/17* (2013.01); *H01L 24/73* (2013.01); *H01L 2224/81205* (2013.01); *H01L 2224/8385* (2013.01)

(58) Field of Classification Search
   CPC ......... H01L 23/49555; H01L 23/49575; H01L 23/49513; H01L 23/4952; H01L 23/3121; H01L 24/17; H01L 24/72; H01L 23/49568; H01L 2224/13147; H01L 2224/13144
   USPC ....................................................... 257/675
   See application file for complete search history.

(56) References Cited

U.S. PATENT DOCUMENTS

| | | | | |
|---|---|---|---|---|
| 2005/0224945 | A1* | 10/2005 | Saito | H01L 23/49575 257/686 |
| 2007/0045785 | A1* | 3/2007 | Noquil | H01L 23/3107 257/666 |
| 2009/0057852 | A1* | 3/2009 | Madrid | H01L 23/4334 257/670 |
| 2014/0001480 | A1* | 1/2014 | Otremba | H01L 23/3107 257/76 |

(Continued)

*Primary Examiner* — Anthony Ho
*Assistant Examiner* — Mohammad M Hoque
(74) *Attorney, Agent, or Firm* — Korus Patent, LLC; Seong Il Jeong

(57) ABSTRACT

A clip-bonded semiconductor chip package comprises a lead frame having a pad and a lead; a semiconductor chip bonded onto the pad of the lead frame; a bonding pad on the semiconductor chip; metal bumps formed on the bonding pad; a clip having first and second portions coupled to each other wherein the first portion is bonded to the bonding pad via the metal bumps, wherein the second portion is bonded to the lead of the lead frame; and a package body made of a molding material around the lead frame, the semiconductor chip and the clip.

4 Claims, 7 Drawing Sheets

(56) References Cited

U.S. PATENT DOCUMENTS

2017/0309554 A1* 10/2017 Mangrum ......... H01L 23/49562

* cited by examiner (a)

(b)

(a)

(b)

__US 10,256,207 B2__

CLIP-BONDED SEMICONDUCTOR CHIP PACKAGE USING METAL BUMPS AND METHOD FOR MANUFACTURING THE PACKAGE

CROSS-REFERENCE TO RELATED APPLICATION

This application is a continuation in part application of U.S. application Ser. No. 15/407,198 which claims the benefit of Korean patent application No. 10-2016-0006330 filed on Jan. 19, 2016, the entire content of which is incorporated herein by reference for all purposes as if fully set forth herein.

BACKGROUND

Field of the Present Disclosure

The present disclosure relates to a clip-bonded semiconductor chip package using metal bumps and a method for manufacturing the package. More particularly, the present disclosure relates to a clip-bonded semiconductor chip package using metal bumps and a method for manufacturing the package, wherein a semiconductor chip and a substrate or lead frame is electrically connected to each other via a clip using metal bumps without forming a separate metal layer on the bonding pad surface of the semiconductor chip.

Discussion of Related Art

Generally, a semiconductor chip package includes a semiconductor chip or a die, a lead frame, and a case body. The semiconductor chip is attached onto the lead frame pad, and is electrically connected to a lead of the lead frame via a bonding wire.

Among various semiconductor chip packages, a semiconductor chip package to implement a power semiconductor device such as IGBT or power MOSFET, etc. requires low switching loss and conductance loss and low on-resistance between source-drain (RdsON).

Recently, the semiconductor chip package for a high-voltage large-current device such as the semiconductor chip package to implement a power semiconductor device such as IGBT or power MOSFET, etc. may employ not a bonding wire but a conductive clip.

For example, FIG. 1 shows a conventional clip-bonded semiconductor chip package wherein a semiconductor chip 20 is mounted on a lead frame pad 10, and the semiconductor chip 20 and a lead 30 on a substrate is bonded to each other via a clip 40. Upon completion of the clip bonding, a thermosetting molding material such as EMC (Epoxy molding compound) fills to form a package body 50. In this way, the semiconductor chip package may be completed. When the semiconductor chip and lead is bonded to each other via the clip, electrical properties may not be deteriorated and a bonding process may be simple due to absence of bonding wires.

In order to realize the bonding between the semiconductor chip 20 and clip 40, a bonding pad may be formed on the semiconductor chip 20. The bonding pad refers to a deposited metal film for facilitating connection between the semiconductor chip and the wire or clip 40. The bonding pad may be made of aluminum (Al) and may have a square shape. However, since the bonding pad is made of aluminum, it could not be perfectly soldered. Thus, to achieve soldering of the clip, a separate metal layer such as Ni/Pd/Au or Ni/Au or Ag should be formed on the bonding pad. This may lead to a complicated bonding process and a lowered production rate.

PRIOR ART DOCUMENT

Patent Document

Patent document 0001: Korean patent No. 10-1208332 "CLIP STRUCTURE FOR SEMICONDUCTOR PACKAGE AND SEMICONDUCTOR PACKAGE USING THE SAME";

Patent document 0002: Korean patent No. 10-1245383 "METHOD FOR ATTACHING CLIP FOR SEMICONDUCTOR PACKAGE AND METHOD FOR MANUFACTURING SEMICONDUCTOR PACKAGE USING THE SAME"; and Patent document 0003: Korean patent application publication No. 2011-0094126 "SEMICONDUCTOR DIE PACKAGE HAVING CLIP WIRING"

SUMMARY

The present disclosure is to provide to a clip-bonded semiconductor chip package using metal bumps wherein a semiconductor chip and a substrate or lead frame is electrically connected to each other via a clip which is attached to a bonding pad surface of the semiconductor chip using metal bumps without forming a separate metal layer on the bonding pad surface of the semiconductor chip.

In one aspect of the present disclosure, a clip-bonded semiconductor chip package comprises: a lead frame having a pad and a lead; a semiconductor chip bonded onto the pad of the lead frame; a bonding pad on the semiconductor chip; metal bumps formed on the bonding pad; a clip having first and second portions wherein the first portion is bonded to the bonding pad and the second portion is bonded to the lead of the lead frame; and a package body made of a molding material around the lead frame, wherein the bonding pad comprises Al and the metal bumps comprise Cu or Au or Al, by which a conductive adhesive material can be filled between the bonding pad and the first portion of the clip, thus enabling the bonding pad and the first portion of the clip to be bonded together, and wherein the metal bumps are firmly bonded onto the bonding pad by ultrasonic welding, and do not directly contact with the clip, thus an electrical conductivity is achieved in an order of the bonding pad, the metal bumps, the conductive adhesive material and the clip.

In one implementation of the clip-bonded semiconductor chip package, the conductive adhesive material includes a solder or a conductive epoxy-based adhesive material.

In one implementation of the clip-bonded semiconductor chip package, the second portion of the clip has a downset extending downwardly and inclinedly, wherein the downset has a distal end portion contacting the lead of the lead frame, wherein only an edge of the distal end portion contacts a surface of the lead of the lead frame, wherein a second conductive adhesive material is formed between the distal end portion and the lead of the lead frame.

In another aspect of the present disclosure, a clip-bonded semiconductor chip package comprises: a lead frame having a pad and a lead; a semiconductor chip bonded onto the pad of the lead frame; a bonding pad on a first surface of the semiconductor chip; metal bumps formed on the bonding pad; a clip having first and second portions wherein the first portion is bonded to the bonding pad via a conductive adhesive material and the second portion is bonded to the lead of the lead frame; and a package body made of a molding material around the lead frame, wherein the bonding pad comprises Al and the metal bumps comprise Cu or Au or Al, by which a conductive adhesive material can be filled between the bonding pad and the first portion of the clip, thus enabling the bonding pad and the first portion of the clip to be bonded together, and wherein the metal bumps are firmly bonded onto the bonding pad by ultrasonic welding, and do not directly contact with the clip, thus an electrical conductivity is achieved in an order of the bonding pad, the metal bumps, the conductive adhesive material and the clip.

In accordance with the present disclosure, when the chip and clip are coupled to each other, the metal bumps are formed on the bonding pad for the semiconductor chip. Thus, the clip is connected to the semiconductor chip while a separate metal layer is not formed on the bonding pad. This may lead to a simple bonding process and, thus, an improved production rate of the package.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTIONS

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

Figure 1:
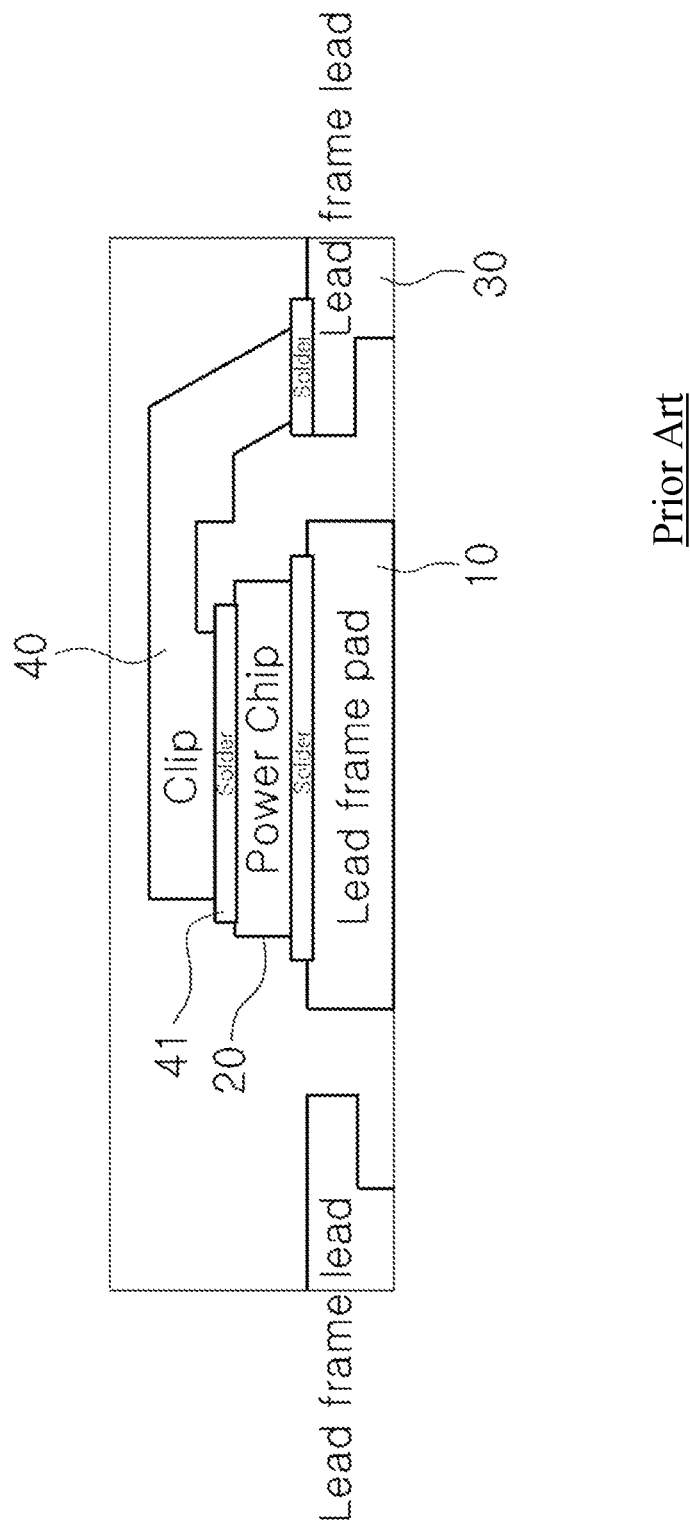
FIG. 1 is a cross-sectional view of a conventional clip-bonded semiconductor chip package.
Figure 2:
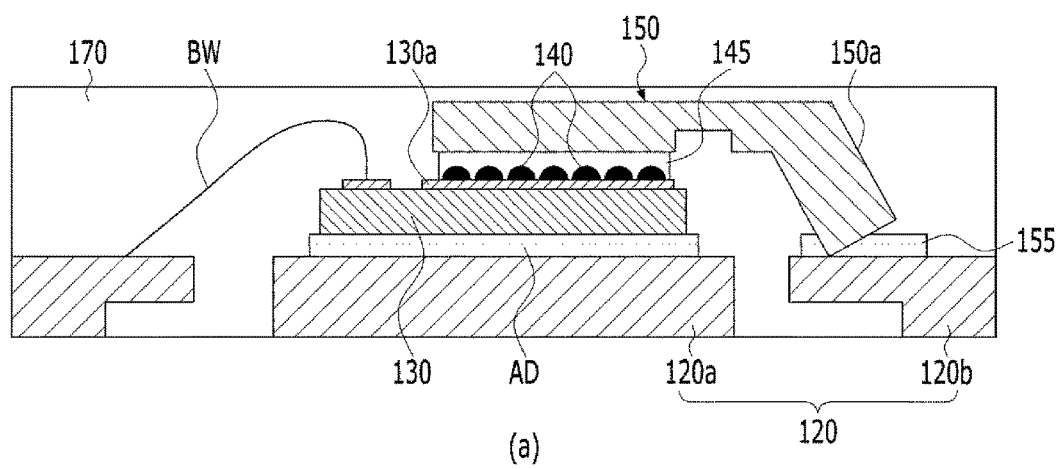
FIG. 2 shows cross-sectional views of a clip-bonded semiconductor chip package in accordance with a preferred first embodiment of the present disclosure.
Figure 2:
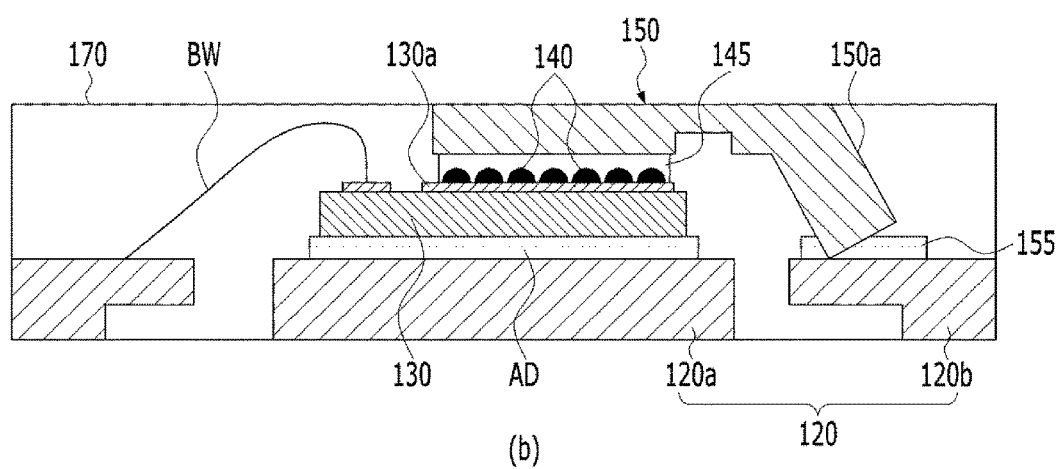

FIG. 2 shows cross-sectional views of a clip-bonded semiconductor chip package in accordance with a preferred first embodiment of the present disclosure. In the present clip-bonded semiconductor chip package, a semiconductor chip 130 is bonded to a pad 120a of a lead frame 120 by a solder or an electrically conductive adhesive of an epoxy type; a bonding pad 130a of aluminum material is formed on the semiconductor chip 130. The bonding pad 130a is bonded to one end of a clip 150. Herein the "bonding" of the bonding pad 130a to the clip 150 means structural connection of the bonding pad 130a to the one end of the clip 150, and not necessarily means bonding by direct contact. The other end of the clip 150 is bonded to a lead 120b of the lead frame 120 by a solder or an epoxy-based electrically conductive adhesive. A surrounding thereof is filled with a thermosetting molding material such as EMC to form a package body 170.

As already mentioned above, on the semiconductor chip 130, the bonding pad 130a for bonding the clip 150 is formed. Since the bonding pad 130a is made of an aluminum material, pertinent and perfect soldering is not achieved, and thus not well compared with the prior arts in an electrical and thermal point of view. Thus, a separate metal layer must be formed on the bonding pad 130a for perfect soldering bonding with the clip 150. However, in accordance with the present disclosure, in order to directly solder the clip 150 to the bonding pad 130a without performing the metal layer forming process, metal bumps 140 are formed on the bonding pad 130a of the semiconductor chip 130, as shown in FIG. 2.

The metal bumps 140 refer to means for facilitating the bonding between the bonding pad 130a of the semiconductor chip 130 and the clip 150 to enable the transfer of electricity and heat between the semiconductor chip 130 and the clip 150. The metal bumps 140 are embodied as a protrusion bonded on the bonding pad 130a. The metal bumps 140 are made of a metal material capable of soldering, such as copper (Cu) or gold (Au) or Aluminum (Al). These metals can be bonded if used with a conductive adhesive material. The metal bumps 140 may have various shapes such as a spherical shape, an elliptical shape, or a cylindrical shape.

A conductive solder or a conductive epoxy-based adhesive (hereinafter, referred to as "conductive adhering film 145") is applied on a surface of the bonding pad 130a on which the metal bumps 140 are formed. One end of the clip 150 is bonded on the conductive adhering film 145. Accordingly, the clip 150 is electrically connected to the metal bumps 140 by the conductive adhering film 145. Further, since the metal bumps 140 are conductive, it is electrically connected to the bonding pad of the semiconductor chip 130, and, thus, the semiconductor chip 130 and the clip 150 are electrically connected to each other.

In accordance with a preferred example of the present disclosure, the bonding pad 130a comprises Al and the metal bumps 140 comprise Cu or Au or Al. This combination enables a conductive adhesive material such as the conductive adhering film 145 to be filled between the bonding pad 130a and the one end of the clip 150, making the bonding pad 130a and the one end of the clip 150 be bonded together. Further, the metal bumps 140 are firmly bonded onto the bonding pad 130a by ultrasonic welding, and do not directly contact with the clip, thus an electrical conductivity is achieved in the order of the bonding pad 130a, the metal bumps 140, the conductive adhesive material or the conductive adhering film 145, and the clip 150. In this case, it is not necessary to make the diameter of metal bumps 140 be equal to thickness of the conductive adhering film 145, and thus it is possible to form various types of small metal bumps 140.

The other end of the clip 150 is connected to a lead 120b of the lead frame 120 via conductive adhering means (a solder or epoxy-based conductive adhesive) 155. To this end, the other end of the clip 150 has a downset 150a extending downwards and in an inclined manner. The downset 150a end is coupled to the lead 120b of the lead frame 120.

Figure 3:
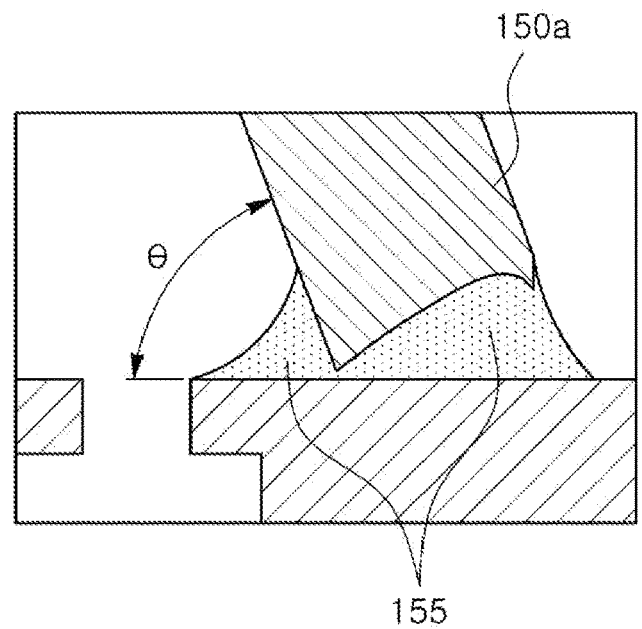
FIG. 3 shows enlarged views of combinations between a lead of a lead frame and a clip downset end for a clip-bonded semiconductor chip package in accordance with an embodiment of the present disclosure.
Figure 3:
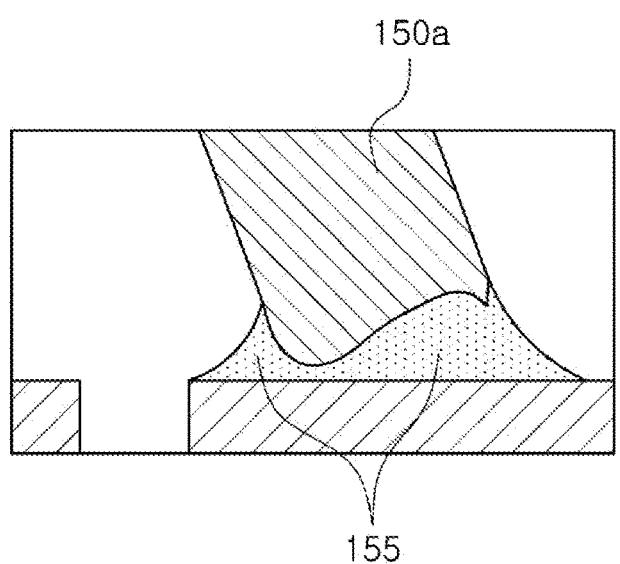

In this connection, the downset 150a end of the clip 150 and the lead 120b of the lead frame 120 may be coupled in a state where flat surfaces are mutually bonded, i.e., in a surface contact state. However, the present disclosure is not limited thereto. As shown in FIG. 2 and FIG. 3, it is preferable that one side edge portion of the downset 150a end of the clip 150 is coupled to the lead 120b so as to contact the surface of the lead 120b. This is to improve the adhesion between the clip 150 and the lead 120b of the lead frame 120. In this connection, when the edge of the downset 150a end of the clip 150 contacts the surface of the lead 120b of the lead frame 120, a predetermined angle space is defined between a bottom end face of the downset 150a end of the clip 150 and the surface of the lead 120b and the lead frame 120. Then, the space is filled with the conductive adhering means 155 to fix the clip 150 to the lead 120b. In this connection, the contact area of the clip 150 and the conductive adhering means 155 becomes larger. Further, as the conductive adhering means 155 are cured, the clip 150 is firmly secured by the cured conductive adhering means 155. Thus, the bonding between the clip 150 and the lead 120b of the lead frame 120 is improved.

The lower edge of the downset 150a end of the clip 150 edge is shown in FIG. 3a to be configured in a pointed shape. Alternatively, the lower edge of the downset 150a end of the clip 150 edge is shown in FIG. 3b to be configured into a blunt shape. A angle θ between an inner inclined side face of the downset 150a and the surface of the lead 120b of the leaf frame 120 may be in a range of about 30 to 90 degrees.

As shown in FIG. 2, another bonding pad on the semiconductor chip 130 may be connected to another lead of the lead frame via a wire BW. In an alternative, another bonding pad on the semiconductor chip 130 may be connected to another lead of the lead frame via another clip.

Moreover, as shown in FIG. 2 and as mentioned above, after the clip 150 is bonded to the semiconductor chip 130 and lead 120b of the lead frame 120, the surrounding thereof is sealed with a molding material such as EMC. In this connection, as shown in FIG. 2a, the clip 150 may be configured to be surrounded by the molding material and not exposed to the outside. Alternatively, as shown in FIG. 2b, in order to discharge the heat generated from the semiconductor chip 130 and clip 150 to the outside, 2, the package body 170 may be formed by filling the molding material such that the top surface of the clip 150 may be exposed to the outside.

Figure 4:
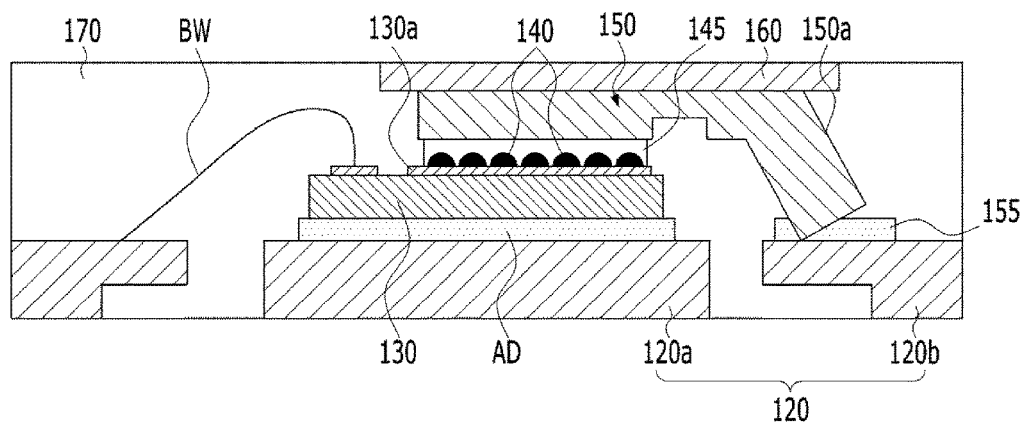
FIG. 4 shows a cross-sectional view of a clip-bonded semiconductor chip package in accordance with a preferred second embodiment of the present disclosure.

FIG. 4 shows a cross-sectional view of a clip-bonded semiconductor chip package in accordance with a preferred second embodiment of the present disclosure. In this embodiment, the metal bumps 140 are formed on the bonding pad of the semiconductor chip 130, and the clip 150 is bonded to the bonding bad by the conductive adhering film 145. In addition, a heat dissipating slug 160 for discharging heat generated from the semiconductor chip 130 and the clip 150 to the outside is bonded to the upper surface of the clip 150. The heat dissipation slug 160 is formed in a rectangular plate shape made of a metal material having excellent thermal conductivity. The heat dissipation slug 160 is bonded to the clip 150 on a top face thereof, for example, by a conductive adhesive or ultrasonic welding. The heat dissipation slug 160 is disposed such that a top surface thereof is exposed to the outside of the package body 170. In this embodiment, connection of the bonding pad to the clip 150 is the same as that of the first embodiment, and further explanations are omitted for clarity.

Figure 5:
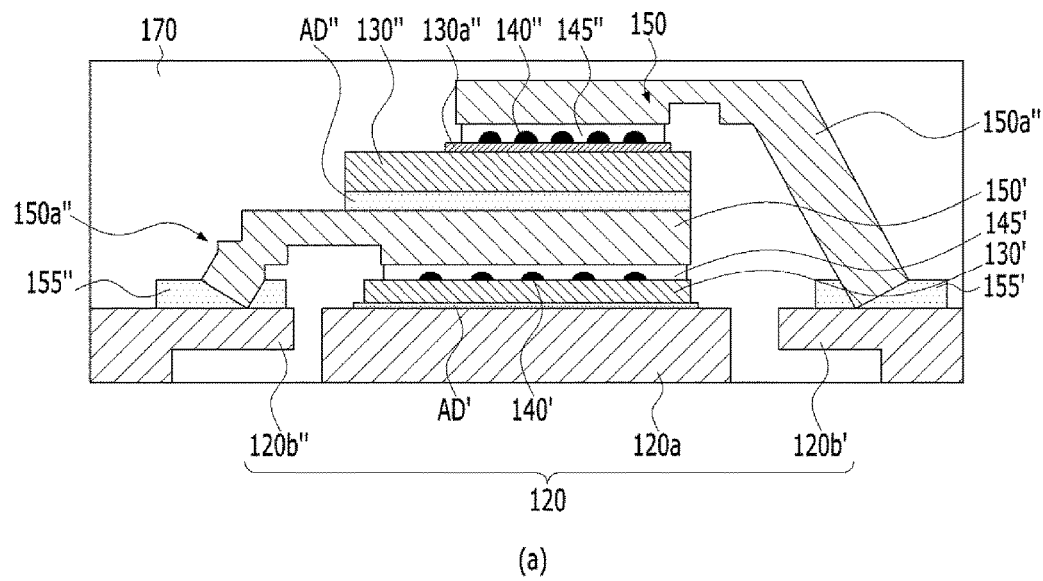
FIG. 5 shows a cross-sectional view of a clip-bonded semiconductor chip package in accordance with a preferred third embodiment of the present disclosure.
Figure 5:
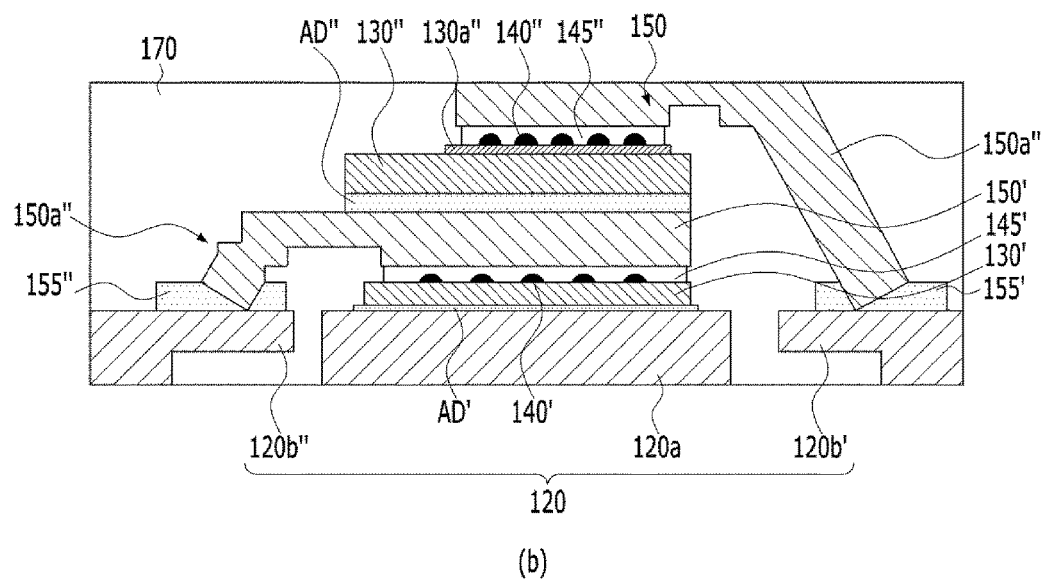

FIG. 5 shows cross-sectional views of a clip-bonded semiconductor chip package in accordance with a preferred third embodiment of the present disclosure. In this embodiment, two semiconductor chips are stacked on top of each other, and each clip is bonded to each bonding pad of each semiconductor chip via each metal bump and each conductive adhering means.

More specifically, as shown in FIG. 5, a first semiconductor chip 130' is bonded by an adhesive AD' on a pad 120a of the lead frame 120. First metal bumps 140' are formed on a first bonding pad 130a' on the first semiconductor chip 130'. A first conductive adhesive film 145' is applied to the first bonding pad 130a with the first metal bumps 140' formed thereon. A first clip 150' is bonded onto the first metal bumps 140'. Next, a second semiconductor chip 130" is bonded onto the first clip 150' by a second adhesive AD". Second metal bumps 140" are formed on a second bonding pad 130a". A second conductive adhesive film 145" is applied to the second bonding pad 130a" with the second metal bumps 140 formed thereon. The second clip 150" is bonded onto the second metal bumps 140 and onto the second bonding pad 130. The other ends of the first clip 150' and the second clip 150" are coupled respectively via the first and second conductive adhering means 155' and 155" to the first lead 120b' and the second lead 120b" on the right and left sides of the lead frame 120 respectively. In this embodiment as well, as shown in FIG. 5a, the second clip 150" can be configured to be sealed within the package body 170. As shown in FIG. 5b, the top face of the second clip 150" can be configured to be exposed to the outside of the package body 170 in order to discharge the heat to the outside.

In this embodiment, connection of the bonding pad to the clip 150', 150" is the same as that of the first embodiment, and further explanations are omitted for clarity.

Figure 6:
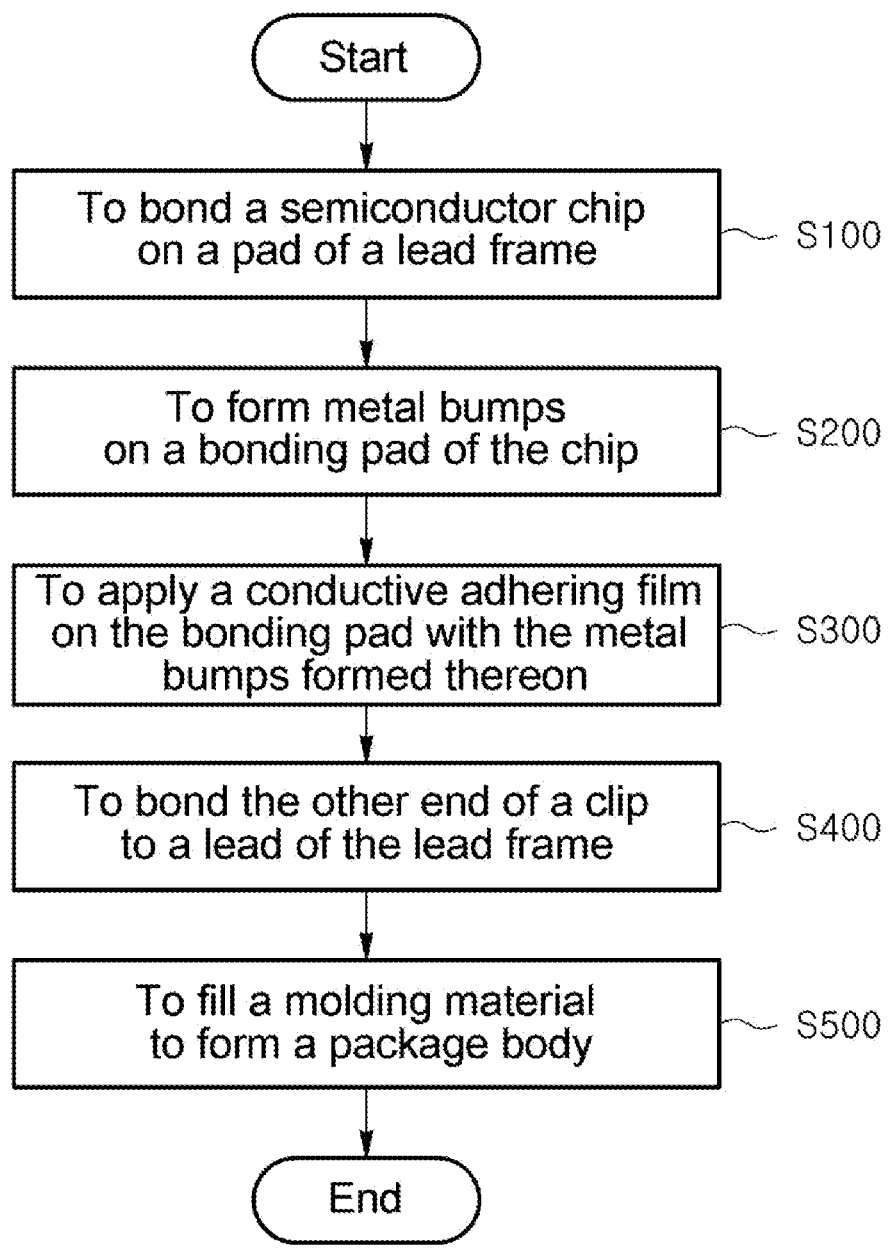
FIG. 6 is a flow chart of a method for manufacturing a clip-bonded semiconductor chip package in accordance with an embodiment of the present disclosure.

Until now, the structures of the clip-bonded semiconductor packages using metal bumps in accordance with various embodiments of the present disclosure have been described. Hereinafter, with reference to FIG. 6, a method for manufacturing the clip-bonded semiconductor package using metal bumps in accordance with an embodiment of the present disclosure will be described. FIG. 6 is a flow chart of a method for manufacturing a clip-bonded semiconductor chip package in accordance with an embodiment of the present disclosure.

As shown in FIG. 6, a method for manufacturing a clip-bonded semiconductor chip package in accordance with an embodiment of the present disclosure may include a semiconductor chip bonding operation S100, a metal bumps forming operation S200, a clip bonding operation S300, a bonding operation between a clip and a lead of a lead frame S400, and a molding operation S500.

As a first operation, in the semiconductor chip bonding operation S100, the semiconductor chip 130 is bonded to the pad 120a of the prepared lead frame 120 using an adhesive. In this connection, an aluminum bonding pad 130a is formed on the semiconductor chip 130 in advance. It is acceptable that a separate metal layer such as Ni/Ti/Au is not formed on the bonding pad 130a surface.

Subsequently, as a second operation, in the metal bumps forming operation S200, on the surface of the bonding pad 130a on the semiconductor chip 130, metal bumps 140 of a solderable metal such as copper or gold are formed.

Figure 7:
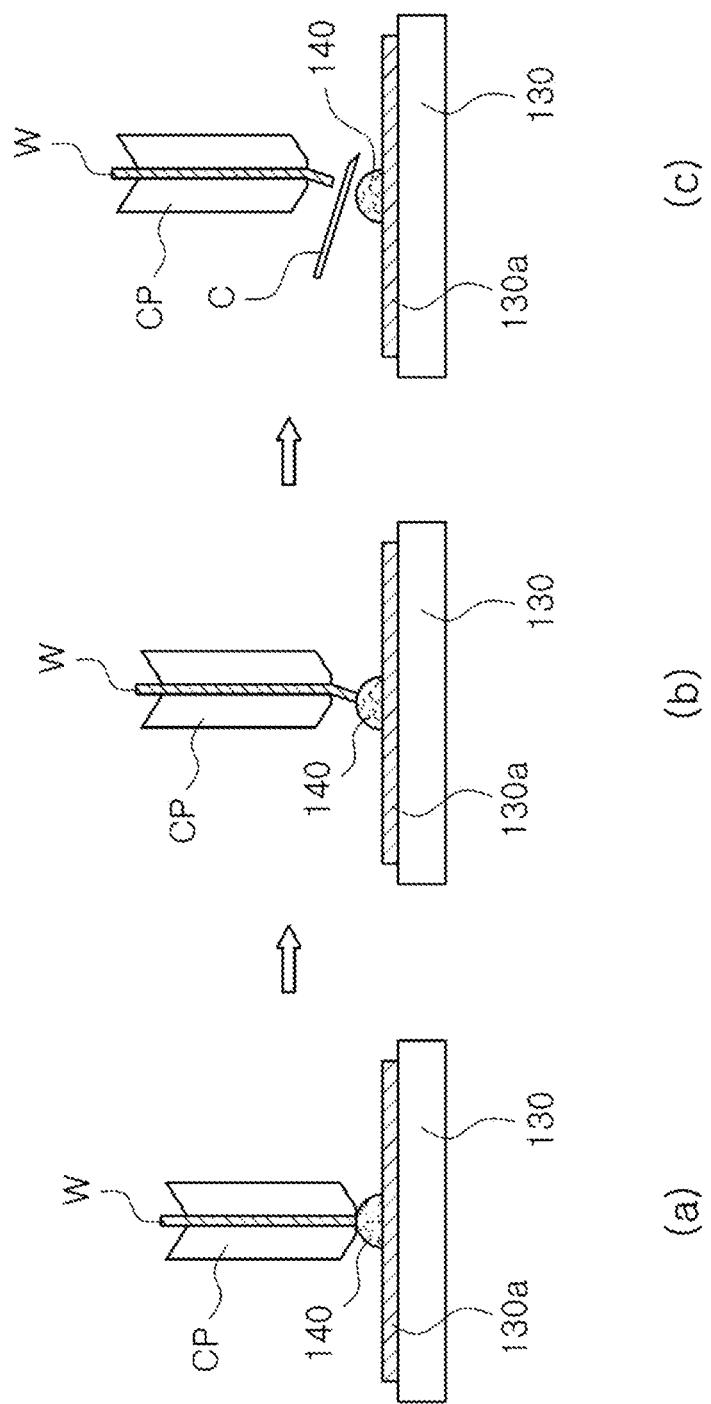
FIG. 7 illustrates a process for forming metal bumps for manufacturing a clip-bonded semiconductor chip package in accordance with an embodiment of the present disclosure.

FIG. 7 illustrates a process for forming the metal bumps 140 for manufacturing a clip-bonded semiconductor chip package in accordance with an embodiment of the present disclosure. As shown, the metal bumps 140 may be formed using a wire melting method. This is a method of applying a general wire bonding method. Specifically, as shown in FIG. 7, a capillary CP having a copper or gold wire W disposed therein is spaced from a bonding pad 130a formed on a semiconductor chip 13. An electrical spark is applied to a tip end of the wire W to melt the wire W to form a metal ball on the bonding pad 130a surface. Subsequently, a portion of the wire W connected to the metal ball is cut using the cutter C while slightly lifting up the capillary CP. The metal balls are then cooled and solidly bonded to the bonding pad surface to complete the metal bumps 140.

Alternatively, the metal bumps 140 may be formed using electrical plating, sputtering, screen printing, etc. In this connection, while the bonding pad 130a is masked with a mask with metal bumps pattern, the electrical plating, sputtering, screen printing, etc. may be applied to form the metal bumps 140.

The metal bumps 140 can be formed by using ultrasonic welding. In this case, stability of structure and electrical conductivity can be achieved by compact bonding of metals.

After the metal bumps 140 are formed on the bonding pad 130a of the semiconductor chip 130, a clip bonding operation S300 is performed as a third operation. In this operation, a conductive adhering film 145 is applied to a bonding pad 130a having metal bumps 140 formed thereon. Then, the clip 150 is bonded on the conductive adhering film 145 on the bonding pad 130a.

Subsequently, as a fourth operation, the clip 150 and a lead 120b of the lead frame 120 are boned to each other S400. In this operation, the other end of the clip 150, specifically, the downset 150a end of the clip 150, is bonded to the lead 120b of the lead frame 120 with the conductive adhering means 155. In this connection, as shown in FIG. 2 and FIG. 3, it is preferable that one side edge portion of the downset 150a end of the clip 150 is coupled to the lead 120b so as to contact the surface of the lead 120b. This is to improve the adhesion between the clip 150 and the lead 120b of the lead frame 120. In this connection, when the edge of the downset 150a end of the clip 150 contacts the surface of the lead 120b of the lead frame 120, a predetermined angle space is defined between a bottom end face of the downset 150a end of the clip 150 and the surface of the lead 120b and the lead frame 120. Then, the space is filled with the conductive adhering means 155 to fix the clip 150 to the lead 120b. In this connection, the contact area of the clip 150 and the conductive adhering means 155 becomes larger. Further, as the conductive adhering means 155 are cured, the clip 150 is firmly secured by the cured conductive adhering means 155. Thus, the bonding between the clip 150 and the lead 120b of the lead frame 120 is improved.

Subsequently, as a fifth operation, in the molding operation S160, a surrounding around the lead frame 120, and the semiconductor chip 130, and the clip 150 is filled with a thermosetting molding material such as EMC to form a package body 170. In this way, the semiconductor chip package as shown in FIG. 2 is completed.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A clip-bonded semiconductor chip package comprising:
   a lead frame having a pad and a lead;
   a semiconductor chip bonded onto the pad of the lead frame;
   a bonding pad on the semiconductor chip;
   metal bumps formed on the bonding pad;
   a clip having first and second portions wherein the first portion is bonded to the bonding pad and the second portion is bonded to the lead of the lead frame; and
   a package body made of a molding material around the lead frame,
   wherein the bonding pad comprises Al and the metal bumps comprise Cu or Au or Al, by which a conductive adhesive material can be filled between the bonding pad and the first portion of the clip, thus enabling the bonding pad and the first portion of the clip to be bonded together,
   and wherein the metal bumps are firmly bonded onto the bonding pad by ultrasonic welding, and do not directly contact the clip, thus an electrical conductivity is achieved in an order of the bonding pad, the metal bumps, the conductive adhesive material and the clip.

2. The clip-bonded semiconductor chip package of claim 1, wherein the conductive adhesive material includes a solder or a conductive epoxy-based adhesive material.

3. The clip-bonded semiconductor chip package of claim 1, wherein the second portion of the clip has a downset extending downwardly and inclinedly, wherein the downset has a distal end portion contacting the lead of the lead frame, wherein only an edge of the distal end portion contacts a surface of the lead of the lead frame, wherein a second conductive adhesive material is formed between the distal end portion and the lead of the lead frame.

4. A clip-bonded semiconductor chip package comprising:
   a lead frame having a pad and a lead;
   a semiconductor chip bonded onto the pad of the lead frame;
   a bonding pad on a first surface of the semiconductor chip;
   metal bumps formed on the bonding pad;
   a clip having first and second portions wherein the first portion is bonded to the bonding pad via a conductive adhesive material and the second portion is bonded to the lead of the lead frame; and
   a package body made of a molding material around the lead frame, the semiconductor chip and the clip,
   wherein the bonding pad comprises Al and the metal bumps comprise Cu or Au or Al, by which the conductive adhesive material can be filled between the bonding pad and the first portion of the clip, thus enabling the bonding pad and the first portion of the clip to be bonded together,
   and wherein the metal bumps are firmly bonded onto the bonding pad by ultrasonic welding, and do not directly contact the clip, thus an electrical conductivity is achieved in an order of the bonding pad, the metal bumps, the conductive adhesive material and the clip.

* * * * *